United States Patent
Ahmed et al.

(10) Patent No.: US 12,355,434 B1
(45) Date of Patent: Jul. 8, 2025

(54) INTEGRATED CIRCUIT CONTROL APPARATUS AND METHOD

(71) Applicant: Halo Microelectronics International, Campbell, CA (US)

(72) Inventors: Muhammad Ahmed, Garland, TX (US); Wenchao Qu, Plano, TX (US); Kuangyu Chiang, Saint Paul, TX (US)

(73) Assignee: Halo Microelectronics International, Campbell, CA (US)

( * ) Notice: Subject to any disclaimer, the term of this patent is extended or adjusted under 35 U.S.C. 154(b) by 51 days.

(21) Appl. No.: 18/408,516

(22) Filed: Jan. 9, 2024

(51) Int. Cl.
*H03K 17/00* (2006.01)
*H03K 17/56* (2006.01)

(52) U.S. Cl.
CPC .................................... *H03K 17/56* (2013.01)

(58) Field of Classification Search
CPC .. G06F 13/404; G06F 13/4282; G06F 13/364; H03K 17/56; H03K 17/687; H03K 17/6872

See application file for complete search history.

(56) References Cited

U.S. PATENT DOCUMENTS

| | | | |
|---|---|---|---|
| 11,630,796 B2* | 4/2023 | Jansen | G06F 13/4022 710/110 |
| 2012/0072628 A1* | 3/2012 | Crockett | G06F 13/4291 710/110 |
| 2014/0254431 A1* | 9/2014 | Yan | H04Q 11/04 370/255 |
| 2018/0276157 A1* | 9/2018 | Lofamia | G06F 13/404 |
| 2022/0188262 A1* | 6/2022 | Heckroth | G06F 13/4282 |
| 2022/0269627 A1* | 8/2022 | Teferi | G06F 13/362 |
| 2022/0358077 A1* | 11/2022 | Jansen | G06F 13/4282 |
| 2023/0314258 A1* | 10/2023 | Mihaescu | B60C 23/0474 73/1.57 |

* cited by examiner

*Primary Examiner* — Tuan T Lam
(74) *Attorney, Agent, or Firm* — AP3 Law Firm PLLC (57) ABSTRACT

An apparatus includes an enable circuit having a first input configured to receive a serial data in (SDI) signal, a second input configured to receive a not chip select (nCS) signal, a third input configured to receive a hold (HLD) signal, and an output configured to generate an internal enable signal for controlling a power-up process and a power-down process of an integrated circuit, and a digital core circuit configured to generate the HLD signal after the integrated circuit is powered up by the SDI signal and the nCS signal.

20 Claims, 8 Drawing Sheets

INTEGRATED CIRCUIT CONTROL APPARATUS AND METHOD

TECHNICAL FIELD

The present invention relates to an integrated circuit control apparatus and method, and, in particular embodiments, to an enable circuit for efficiently operating a large integrated circuit system having a microcontroller and a plurality of integrated circuits coupled to the microcontroller.

BACKGROUND

Figure 1:
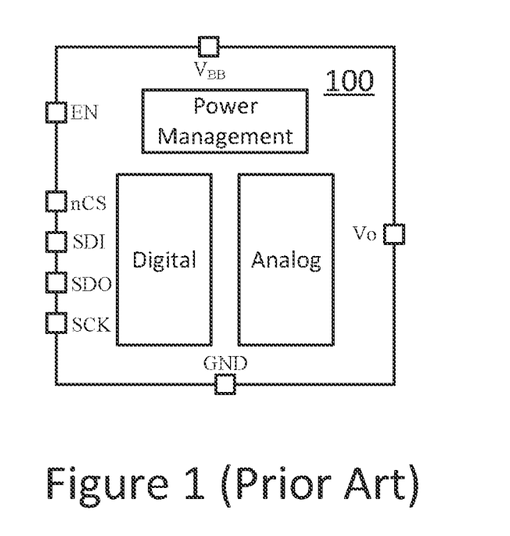
FIG. 1 illustrates an integrated circuit having an enable terminal.

Serial Peripheral Interface (SPI) was created in the 1980s as a way to communicate between a microcontroller and various integrated circuits coupled to the microcontroller. Most of the integrated circuits have an enable terminal configured to control the power-up and the power-down processes of the integrated circuit. FIG. 1 illustrates an integrated circuit having an enable terminal. As shown in FIG. 1, the integrated circuit 100 comprises a power management function block, a digital core and an analog circuit block.

The integrated circuit 100 further comprises at least eight input/output terminals, namely a power supply bus terminal $V_{BB}$, an output voltage terminal VO, a ground terminal GND, an enable terminal EN, an SDI terminal, an SDO terminal, an SCK terminal and an nCS terminal. The SDI terminal, the SDO terminal, the SCK terminal and the nCS terminal are used to communicate with a microcontroller using SPI signals. The SDI terminal is a serial data in terminal configured as the input line for serial data. The SDO terminal is a serial data out terminal configured as the output line for serial data. The SCK terminal is a serial clock terminal configured to receive the clock signal generated by the microcontroller. The nCS terminal is configured to receive the nCS signal that determine whether the integrated circuit is communicating with the microcontroller at a given time. The enable terminal EN is configured to generate an enable signal. The enable signal is used to control the power-up and power-down processes of the integrated circuit.

Figure 2:
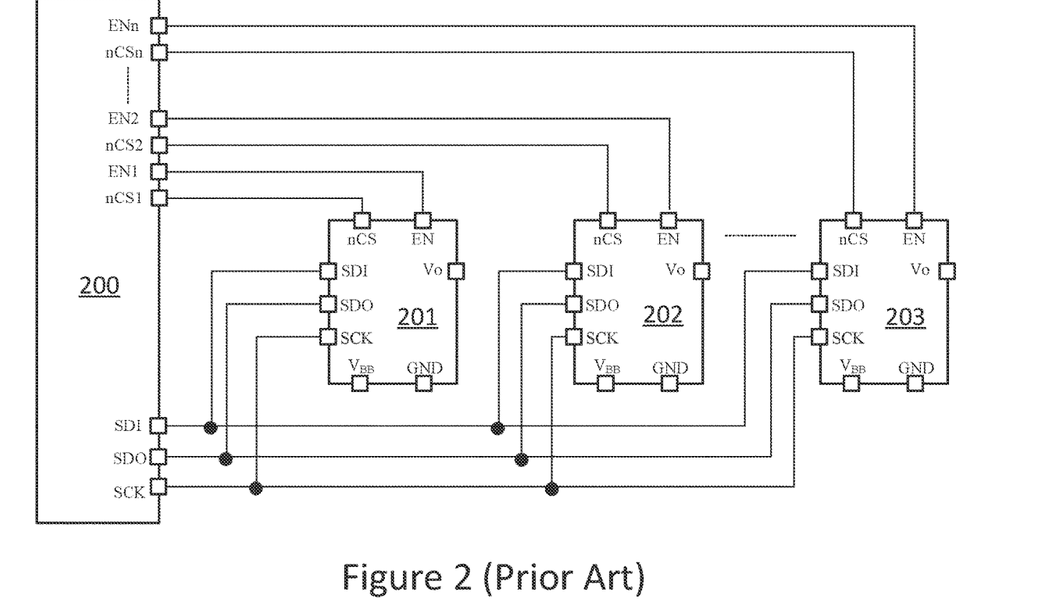
FIG. 2 illustrates a block diagram of a large integrated circuit system including a microcontroller and a plurality of integrated circuits, each of which has an enable terminal.

FIG. 2 illustrates a block diagram of a large integrated circuit system including a microcontroller and a plurality of integrated circuits, each of which has an enable terminal. The large integrated circuit system comprises the microcontroller 200 and the plurality of integrated circuits 201, 202 and 203. Serial communication protocols (e.g., serial peripheral interface) are employed to provide communication channels between various elements of the large integrated circuit system. As shown in FIG. 2, the microcontroller 200 comprises three serial peripheral interface terminals, namely SDI, SDO and SCK. Each integrated circuit (e.g., integrated circuit 201) also comprises SDI, SDO and SCK terminals. As shown in FIG. 2, the SDI, SDO and SCK terminals of the microcontroller 200 are connected to the SDI, SDO and SCK terminals of each integrated circuit, respectively.

The microcontroller 200 also comprises a plurality of not chip select (nCS) terminals, namely nCS1, nCS2, nCSn as shown in FIG. 2. Each integrated circuit (e.g., integrated circuit 201) also comprises an nCS terminal. An nCS terminal (e.g., nCS1) of the microcontroller 200 is connected to a corresponding nCS terminal of the integrated circuit (e.g., the nCS terminal of integrated circuit 201). In operation, the nCS terminals of the microcontroller 200 are configured to generate nCS signals that designate which integrated circuit the microcontroller 200 is communicating with at a given time.

The microcontroller 200 also comprises a plurality of enable terminals, namely EN1, EN2, and ENn as shown in FIG. 2. Each integrated circuit (e.g., integrated circuit 201) also comprises an EN terminal. An EN terminal (e.g., EN1) of the microcontroller 200 is connected to a corresponding EN terminal of the integrated circuit (e.g., the EN terminal of integrated circuit 201). A dedicated EN terminal of the integrated circuit is required here to control the power-up and power-down processes. Once the integrated circuit is powered up, the SPI communication can be established so that the microcontroller 200 can communicate with the integrated circuit through the SPI interface.

In the large integrated circuit system shown in FIG. 2, there may be many integrated circuits, each of which requires a dedicated EN terminal and a routing connection between its EN terminal and the corresponding EN terminal of the microcontroller 200. The dedicated EN terminal(s) and the routing connections between the EN terminals of the integrated circuits and the microcontroller 200 increase the cost and size of the large integrated circuit system. It would be desirable to have a simple and efficient method to control the power-up and power-down processes in the large integrated circuit system. The present disclosure addresses this need.

SUMMARY

These and other problems are generally solved or circumvented, and technical advantages are generally achieved, by preferred embodiments of the present disclosure which provide an enable circuit for efficiently operating a large integrated circuit system having a microcontroller and a plurality of integrated circuits coupled to the microcontroller.

In accordance with an embodiment, an apparatus comprises an enable circuit having a first input configured to receive a serial data in (SDI) signal, a second input configured to receive a not chip select (nCS) signal, a third input configured to receive a hold (HLD) signal, and an output configured to generate an internal enable signal for controlling a power-up process and a power-down process of an integrated circuit, and a digital core circuit configured to generate the HLD signal after the integrated circuit is powered up by the SDI signal and the nCS signal.

In accordance with another embodiment, a method comprises configuring a chip select logic state change of an nCS signal for an integrated circuit to allow a controller to control the integrated circuit, configuring an internal enable signal to change from a first enable logic state to a second enable logic state in response to a data logic state of an SDI signal, and in response to the second enable logic state of the internal enable signal, generating a HLD signal for overwriting the nCS signal and the SDI signal when the internal enable signal is of the second enable logic state.

In accordance with yet another embodiment, a system comprises a controller coupled a plurality of integrated circuits, wherein each integrated circuit comprises an enable circuit having a first input configured to receive an SDI signal, a second input configured to receive an nCS signal, a third input configured to receive a HLD signal, and an output configured to generate an internal enable signal for controlling a power-up process and a power-down process of an integrated circuit, and a digital core circuit configured to generate the HLD signal after the integrated circuit is powered-up by the SDI signal and the nCS signal.

The foregoing has outlined rather broadly the features and technical advantages of the present disclosure in order that the detailed description of the disclosure that follows may be better understood. Additional features and advantages of the disclosure will be described hereinafter which form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

The present disclosure will be described with respect to preferred embodiments in a specific context, namely an enable circuit for efficiently operating a large integrated circuit system having a microcontroller and a plurality of integrated circuits coupled to the microcontroller. The disclosure may also be applied, however, to a variety of integrated circuit systems. Hereinafter, various embodiments will be explained in detail with reference to the accompanying drawings.

Figure 3:
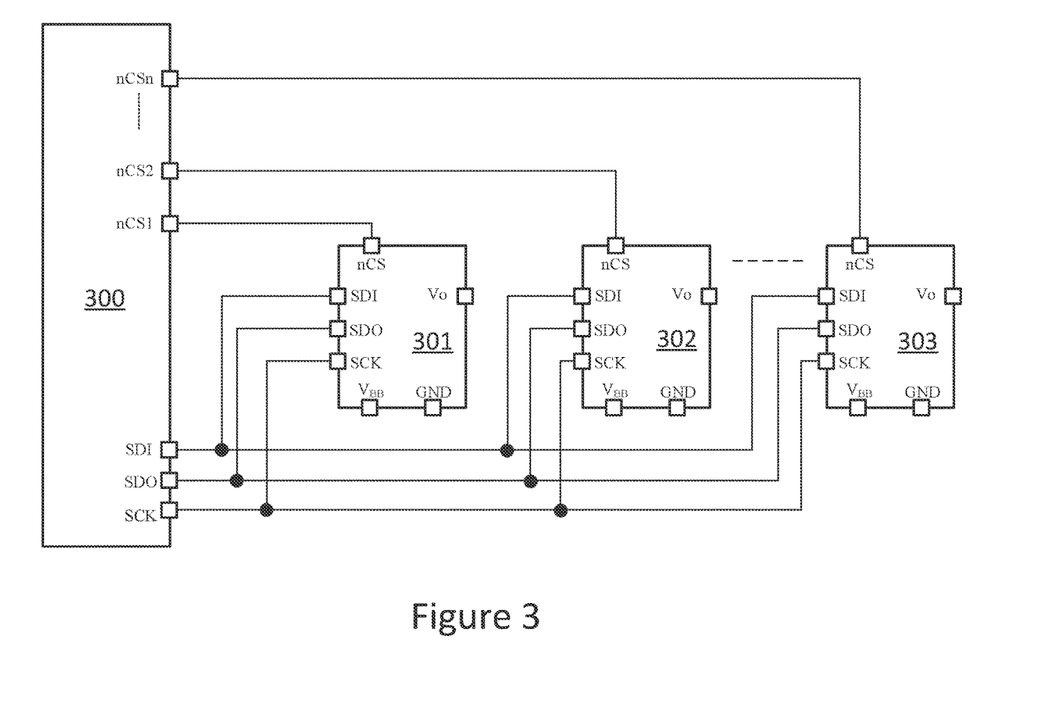
FIG. 3 illustrates a block diagram of a large integrated circuit system including a microcontroller and a plurality of integrated circuits in accordance with various embodiments of the present disclosure.

FIG. 3 illustrates a block diagram of a large integrated circuit system including a microcontroller and a plurality of integrated circuits in accordance with various embodiments of the present disclosure. The large integrated circuit system comprises the microcontroller 300 and the plurality of integrated circuits 301, 302 and 303. Serial communication protocols (e.g., serial peripheral interface) are employed to provide communication channels between various elements of the large integrated circuit system. As shown in FIG. 3, the microcontroller 300 comprises three serial peripheral interface terminals, namely SDI, SDO and SCK. Each integrated circuit (e.g., integrated circuit 301) also comprises SDI, SDO and SCK terminals. As shown in FIG. 3, the SDI, SDO and SCK terminals of the microcontroller 300 are connected to the SDI, SDO and SCK terminals of each integrated circuit, respectively.

While it is understood that large integrated circuit system may employ multiple controllers capable of communicating with a number of integrated circuits, one microcontroller and three integrated circuits are illustrated for simplicity.

SDI is a serial data in terminal. This is the input line for serial data. It is the line through which data is received. SDO is a serial data out terminal. This is the output line for serial data. It is the line through which data is sent or transmitted. SCK is a serial clock terminal. This is the clock signal used to synchronize the data transmission between devices. The clock signal ensures that the sending and receiving devices are synchronized in time, allowing them to correctly interpret the data being sent.

The microcontroller 300 also comprises a plurality of not chip select (nCS) terminals, namely nCS1, nCS2, nCSn as shown in FIG. 3. Each integrated circuit (e.g., integrated circuit 301) also comprises an nCS terminal. An nCS terminal (e.g., nCS1) of the microcontroller 300 is connected to a corresponding nCS terminal of the integrated circuit (e.g., the nCS terminal of integrated circuit 301). The nCS terminals of the microcontroller 300 are configured to generate nCS signals that designate which integrated circuit the microcontroller 300 is communicating with at a given time. In operation, the microcontroller 300 brings the nCS terminal of the desired integrated circuit low. The microcontroller 300 then sends and receives data based on the clock signal. After the data transfer is complete, the microcontroller 300 releases the data transfer lines by bringing the nCS terminal of the desired integrated circuit high. The status change of the nCS terminal indicates that communication with one particular integrated circuit is finished. The nCS terminals and the associated nCS signals allow multiple integrated circuits to share the same SPI buses without interfering with each other, as only the selected integrated circuit responds to the data and clock signals.

In comparison with the large integrated circuit system shown in FIG. 2, the large integrated circuit system shown in FIG. 3 gets rid of the enable terminal for each IC. In operation, the large integrated circuit system shown in FIG. 3 relies on a specific combination of the nCS signal and the SDI signal to power up and power down the integrated circuits 301, 302 and 303. The detailed operating principle of the power-up and power-down processes of the integrated circuits 301, 302 and 303 will be described below with respect to FIGS. 4-6.

One advantageous feature of having the large integrated circuit system shown in FIG. 3 is the elimination of the enable terminals from the integrated circuits and the microcontroller can save a number of input/output terminals, thereby reducing the overall system cost. Furthermore, the reduction of the total number of terminals can make the routing of wires of the large integrated circuit system much easier, thereby reducing the printed circuit board (PCB) area and cost.

Figure 4:
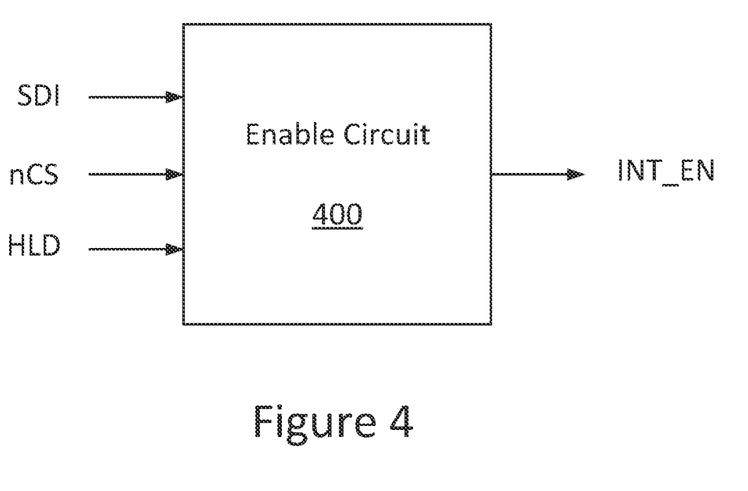
FIG. 4 illustrates a block diagram of an enable circuit in accordance with various embodiments of the present disclosure.

FIG. 4 illustrates a block diagram of an enable circuit in accordance with various embodiments of the present disclosure. Each integrated circuit shown in FIG. 3 comprises an enable circuit 400. As shown in FIG. 4, the enable circuit 400 is configured to receive a serial data in (SDI) signal, a not chip select (nCS) signal and a hold (HLD) signal. Based on the received signals, the enable circuit 400 is configured to generate an internal enable signal INT_EN. The internal enable signal INT_EN is employed to control the power-up process and the power-down process of the integrated circuit.

The enable circuit 400 is implemented as a logic circuit having a first input configured to receive the SDI signal, a second input configured to receive the nCS signal, a third input configured to receive the HLD signal, and an output configured to generate the internal enable signal for controlling the integrated circuit. A digital core circuit of the integrated circuit is configured to generate the HLD signal.

In operation, a chip select logic state change of an nCS signal for the integrated circuit (e.g., integrated circuit 301 shown in FIG. 3) is configured to allow the microcontroller (e.g., the microcontroller 300 shown in FIG. 3) to control the integrated circuit. In a power-up process, the internal enable signal INT_EN of the integrated circuit is configured to change from a first enable logic state (e.g., a logic low state) to a second enable logic state (e.g., a logic high state) in response to a data logic state (e.g., a logic high state) of the SDI signal. In response to the second enable logic state of the internal enable signal, the digital core circuit configures the HLD signal to change from a first HLD logic state (e.g., a logic low state) to a second HLD logic state (e.g., a logic high state). The HLD signal is generated for overwriting the nCS signal and the SDI signal when the internal enable signal INT_EN is of the second enable logic state.

In a power-down process, in response to a power-down command from the microcontroller, the digital core configures the HLD signal to change from the second HLD logic state (e.g., a logic high state) to the first HLD logic state (e.g., a logic low state). The internal enable signal INT_EN changes from a second enable logic state (e.g., a logic high state) to the first enable logic state (e.g., a logic low state) immediately following a logic change of the HLD signal. The integrated circuit is powered down once the internal enable signal has the first enable logic state.

Figure 5:
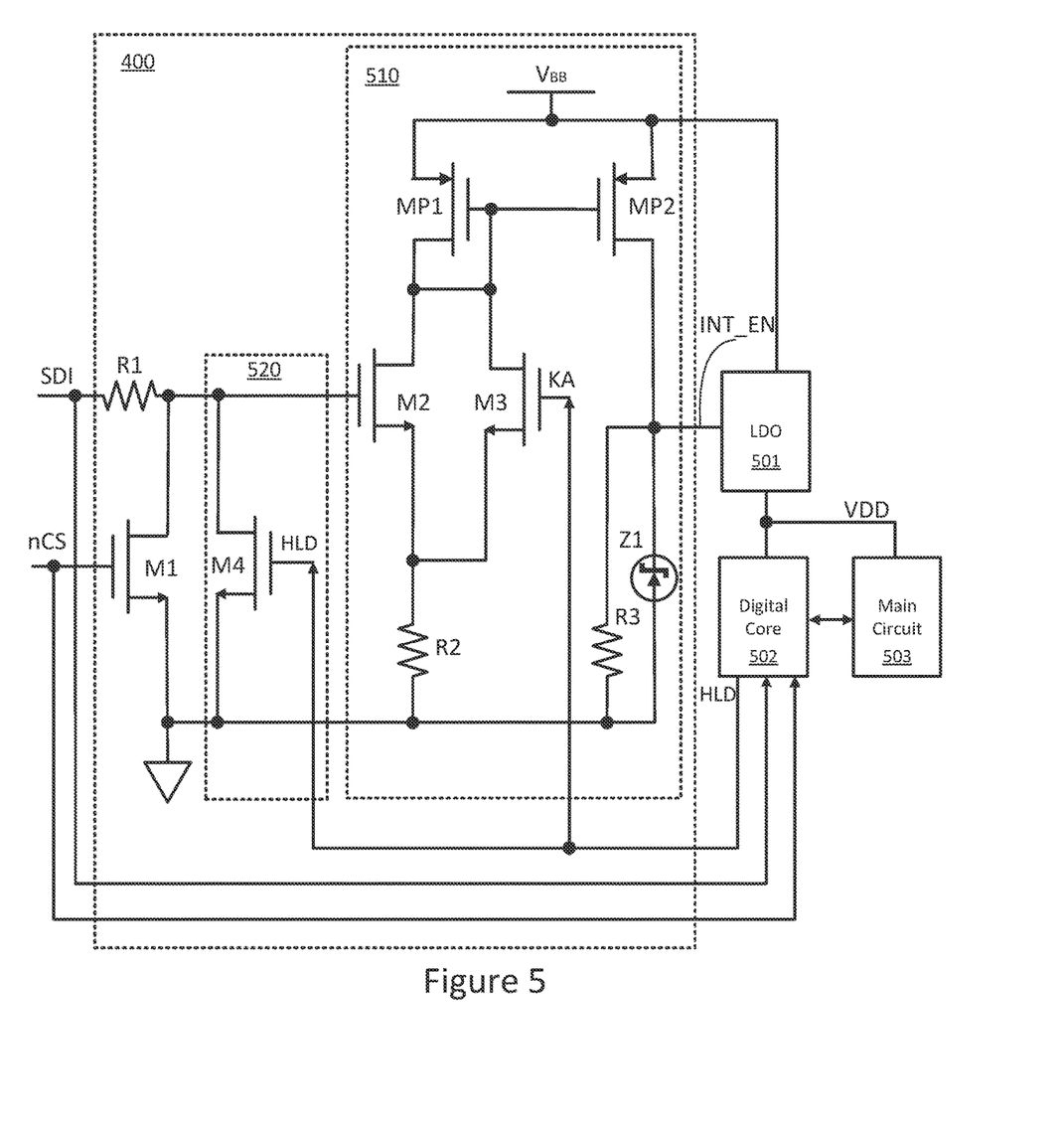
FIG. 5 illustrates a schematic diagram of the enable circuit shown in FIG. 4 in accordance with various embodiments of the present disclosure.

FIG. 5 illustrates a schematic diagram of the enable circuit shown in FIG. 4 in accordance with various embodiments of the present disclosure. The enable circuit 400 comprises a first n-type transistor M1, a second n-type transistor M2, a third n-type transistor M3, a fourth n-type transistor M4, a first p-type transistor MP1, a second p-type transistor MP2, a first resistor R1, a second resistor R2, a third resistor R3 and a Zener diode Z1. The enable circuit 400 is configured to generate an internal enable signal INT_EN fed into a low-dropout (LDO) regulator 501. The LDO regulator 501 is configured to provide bias power VDD to a digital core 502 and a main circuit 503.

As shown in FIG. 5, the first p-type transistor MP1, the second n-type transistor M2 and the second resistor R2 are connected in series between a power supply bus VBs and ground. The power supply bus VBs is coupled to a positive terminal of a battery (not shown). The third n-type transistor M3 is coupled between the first p-type transistor MP1 and ground. More particularly, a drain of the third n-type transistor M3 is connected to a drain of the second n-type transistor M2. A source of the third n-type transistor M3 is connected to a source of the second n-type transistor M2. In some embodiment, a separate resistor can also be used. This resistor is placed between the source of the third n-type transistor M3 and ground. Under this configuration, the source of the n-type transistor M3 is not connected to the source of the second n-type transistor M2 or ground directly.

The second p-type transistor MP2 and the Zener diode Z1 are connected in series between the power supply bus VBs and ground. The third resistor R3 is connected in parallel with the Zener diode Z1. A gate of the second n-type transistor M2 is configured to receive the SDI signal through the first resistor R1 and the nCS signal through the first n-type transistor M1. As shown in FIG. 5, the SDI signal is fed into the gate of the second n-type transistor M2 through the first resistor R1. The nCS signal is applied to the gate of the first n-type transistor M1.

A gate of the third n-type transistor M3 is configured to receive the HLD signal generated by the digital core 502. A gate of the first p-type transistor MP1 and a gate of the second p-type transistor MP2 are connected together and further connected to a drain of the first p-type transistor MP1. The first p-type transistor MP1 and the second p-type transistor MP2 forms a current mirror. As shown in FIG. 5, the internal enable signal INT_EN is generated at a common node of the second p-type transistor MP2 and the Zener diode Z1.

A drain of the first n-type transistor M1 is connected to the gate of the second n-type transistor M2. A gate of the first n-type transistor M1 is configured to receive the nCS signal. A source of the first n-type transistor M1 is connected to ground. The fourth n-type transistor M4 is connected between the gate of the second n-type transistor M2 and ground. More particularly, a drain of the fourth n-type transistor M4 is connected to a drain of the first n-type transistor M1. A source of the fourth n-type transistor M4 is connected to a source of the first n-type transistor M1. A gate of the fourth n-type transistor M4 is configured to receive the HLD signal.

In operation, before the integrated circuit is powered up, when the SDI signal is high and the nCS signal is low, the first n-type transistor M1 is turned off, and the SDI signal drives the gate of the second n-type transistor M2 high to turn it on. The current flowing through the second n-type transistor M2 is mirrored to the right leg formed by the second p-type transistor MP2 and the Zener diode Z1. The current flowing through the second p-type transistor MP2 provides an initial power supply to the LDO 501. The voltage of this power supply is stabilized by the Zener diode Z1. The voltage on the common node of the second p-type transistor MP2 and the Zener diode Z1 can be regarded as the internal enable signal INT_EN. The internal enable signal INT_EN is used to enable the LDO 501. After the LDO 501 is started, the voltage on the power supply bus VBs is converted into the bias voltage VDD for the digital core 502 and the main circuit 503. After the digital core 502 is powered on, the HLD signal (e.g., HLD signal having a logic high state) is generated by the digital core 502. In particular, the digital core 502 sets an internal HLD register to a logic high state or the enable state. As shown in FIG. 5, the HLD signal then takes over the second n-type transistor M2 by turning on the third n-type transistor M3 to maintain the internal enable signal INT_EN at a logic high state.

Optionally, the fourth n-type transistor M4 can be configured to be turned on by the HLD signal. The turn-on of the fourth n-type transistor M4 turns off the second n-type transistor M2. The purpose of having this configuration is to isolate the impact that the SDI and nCS signals may have on the internal enable signal INT_EN after the integrated circuit is powered up. When the HLD signal is high, the turn-on of the fourth n-type transistor M4 prevents the nCS signal from affecting the enable state of the integrated circuit.

In operation, the power-down process is completely carried out through the SPI communication between the microcontroller 300 and the integrated circuit (e.g., integrated circuit 301 shown in FIG. 3). The microcontroller 300 sends a power-down command PD through the SPI interface to the digital core of the integrated circuit (such as setting the register controlling the HLD signal in the integrated circuit to a logic low state), in order to configure the HLD signal to have a logic low state. In response to the logic low state of the HLD signal, the power-down process of the integrated circuit starts. Once the HLD signal has a logic low state, the third n-type transistor M3 is turned off. The turn-off of the third n-type transistor M3 causes the current flowing through the second p-type transistor MP2 to stop. Once the second p-type transistor MP2 is turned off, the internal enable signal INT_EN is pulled down to a low level by the third resistor R3. The LDO 501 is turned off. Thus, the power-down process of the integrated circuit is finished.

It should be noted that the second n-type transistor M2, the third n-type transistor M3, the first p-type transistor MP1, the second p-type transistor MP2, the second resistor R2, the third resistor R3 and the Zener diode Z1 form a raw bias circuit 510 as shown in FIG. 5. The function of the raw bias circuit 510 is similar to an OR gate. Specifically, when both the SDI signal and the inverted signal of the nCS signal have a logic high state, or the HLD signal has a logic high state, the raw bias circuit 510 generates the internal enable signal INT_EN signal having a logic high state.

It should further be noted that the fourth n-type transistor M4 forms an optional block 520 as shown in FIG. 5. The optional block 520 is employed to further reduce the power consumption of the enable circuit 400. Furthermore, once a command setting the register for the HLD signal low (e.g., a power down command PD) is sent through the SPI interface, the nCS signal may be set to a logic high state to prevent the second n-type transistor M2 from being turned on during the power-down process. Alternatively, the SDI signal may be set to a logic low state to achieve the same purpose.

The application scenario of the enable circuit 400 shown in FIG. 5 is that the integrated circuit waiting to be enabled has no internal power supply before being enabled. Although it is connected to the power supply bus $V_{BB}$, there is no internal VDD that can be used by the digital core 502 before the integrated circuit is enabled. As described above, the integrated circuit can be enabled by the SPI signals through using the enable circuit 400, and the VDD can be established by the enable circuit 400 and the LDO 501 to power on the integrated circuit.

Figure 6:
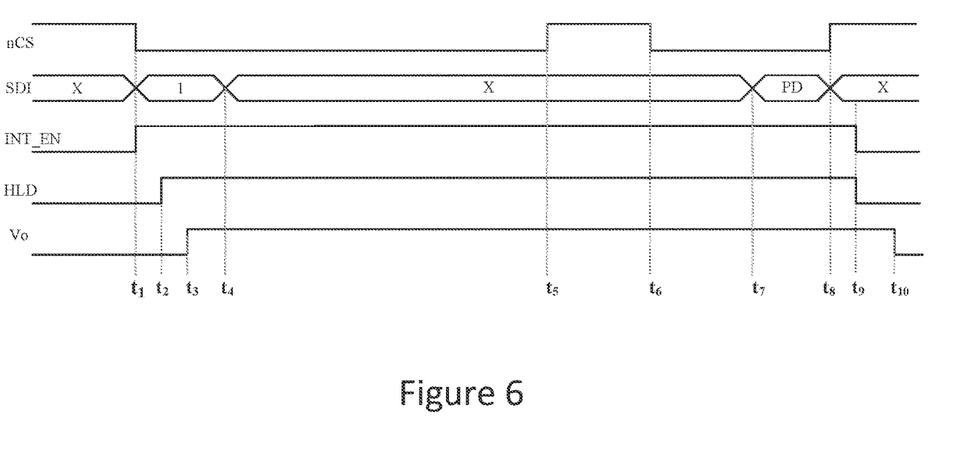
FIG. 6 illustrates various waveforms associated with the enable circuit shown in FIG. 5 in accordance with various embodiments of the present disclosure.

FIG. 6 illustrates various waveforms associated with the enable circuit shown in FIG. 5 in accordance with various embodiments of the present disclosure. The horizontal axis of FIG. 6 represents intervals of time. There may be five rows in FIG. 6. The first row represents the nCS signal. The second row represents the SDI signal. The third row represents internal enable signal INT_EN. The fourth row represents the HLD signal. The fifth row represents the output Vo of the integrated circuit.

Prior to t1, the integrated circuit (e.g., integrated circuit 301 shown in FIG. 3) is at an off state. The output Vo is low and the nCS signal is high. At t1, the nCS signal changes from a logic high state to a logic low state. Referring back to FIG. 5, in response to the logic state change of the nCS signal, the first n-type transistor M1 is turned off. At t1, in order to power up the integrated circuit, the SDI signal has to be high. The logic high state of the SDI signal results in the internal enable signal INT_ENT to go high. Referring back to FIG. 5, when the SDI signal is high, the second n-type transistor M2 is turned on. The current flowing through the second n-type transistor M2 is mirrored to the right leg formed by the second p-type transistor MP2 and the Zener diode Z1. The current flowing through the second p-type transistor MP2 establishes the internal enable signal INT_EN having a logic high state at t1 as shown in FIG. 6.

In response to a rising edge of the internal enable signal INT_EN, the digital core (e.g., digital core 502) configures the HLD signal to change from a HLD logic low state to a HLD logic high state at t2. After a predetermined delay, the output voltage Vo is established at t3. At t4, the communication between the microcontroller and the integrated circuit is as normal as usual. The SDI signal can be any value depending on the functions and/or commands sent by the microcontroller.

After t4, to protect the output voltage Vo from going low once the integrated circuit stops communicating with the microcontroller (e.g., the nCS signal goes high from t5 to t6), the HLD signal overwrites the SDI signal, the nCS signal and a combination of the SDI signal and the nCS signal to maintain the logic high state of the internal enable signal INT_EN. Referring back to FIG. 5, once the HLD signal is high, the third n-type transistor M3 is turned on. The turn-on of the third n-type transistor M3 takes over the second n-type transistor M2 to maintain the internal enable signal INT_EN at a logic high state. Furthermore, once the HLD signal is high, the fourth n-type transistor M4 is turned on. The turn-on of the fourth n-type transistor M4 prevents the nCS signal and/or the SDI signal from affecting the enable state of the integrated circuit.

At t7, the microcontroller sends a power-down command to the integrated circuit through the SDI signal. In response to the power-down command from the microcontroller and after a rising edge of the nCS signal at t8, the digital core configures the HLD signal to change from the HLD logic high state to the HLD logic low state at t9 after a certain counter time.

It should be noted that depending on different applications and design needs, the certain counter time can be zero.

As shown in FIG. 6, the internal enable signal INT_EN changes from an enable logic high state to an enable logic low state immediately following a logic change of the HLD signal at t9. After a predetermined delay (e.g., a power-down time of the integrated circuit), the output voltage Vo of the integrated circuit goes low at t10 once the internal enable signal has the enable logic low state.

One advantageous feature of having the enable control method shown in FIG. 6 is that the existing SPI interface terminals are used to power up and power down the integrated circuit without relying on dedicated enable terminals.

The elimination of the dedicated enable terminals from the integrated circuits and the microcontroller can save a number of input/output terminals, thereby reducing the system complexity and cost.

Figure 7:
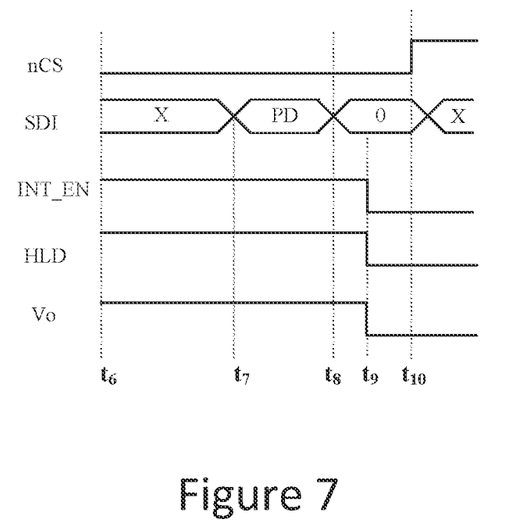
FIG. 7 illustrates various waveforms associated with a different implementation of the enable circuit shown in FIG. 5 in accordance with various embodiments of the present disclosure.

FIG. 7 illustrates various waveforms associated with a different implementation of the enable circuit shown in FIG. 5 in accordance with various embodiments of the present disclosure. The implementation shown in FIG. 7 is similar to that shown in FIG. 6 except that the nCS signal changes from a logic low state to a logic high state after the power-down process is complete. As shown in FIG. 7, from t8 to t10, the SDI signal has a logic low state. Referring back to FIG. 5, as long as the SDI signal remains low after the power-down command is sent, the nCS signal does not need to be pulled high immediately after the power-down command is sent. As shown in FIG. 7, the integrated circuit is disabled after the HLD signal is pulled low.

In short, when the HLD signal is pulled low, at least one of the following conditions ensures the integrated circuit can be turned off. A first condition is pulling the nCS signal high. A second condition is keeping the SDI signal low.

It should be noted that after the HLD signal is pulled low, if the nCS signal and the SDI signal appear in the power-up signal logic state pattern, the HLD register will be written with a logic high state again. Since the HLD signal has a logic high state, the integrated circuit cannot be turned off.

Figure 8:
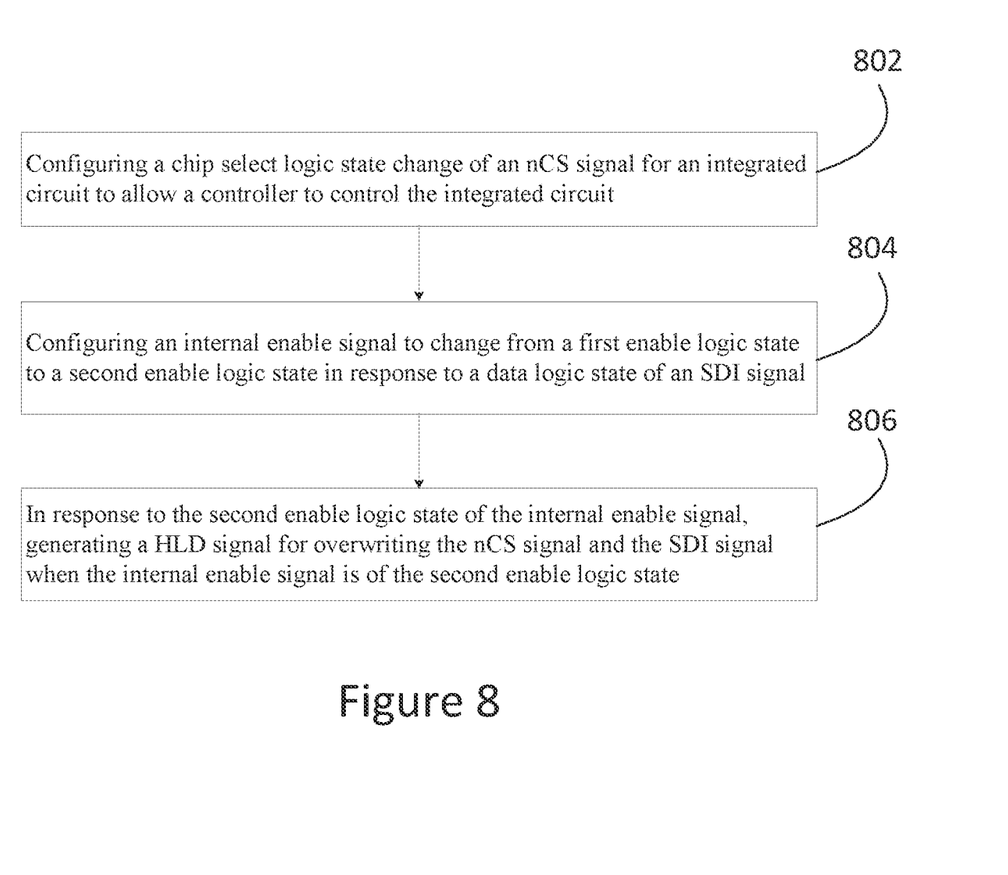
FIG. 8 illustrates a flow chart of operating the enable circuit shown in FIG. 5 in accordance with various embodiments of the present disclosure.

FIG. 8 illustrates a flow chart of operating the enable circuit shown in FIG. 5 in accordance with various embodiments of the present disclosure. This flowchart shown in FIG. 8 is merely an example, which should not unduly limit the scope of the claims. One of ordinary skill in the art would recognize many variations, alternatives, and modifications. For example, various steps illustrated in FIG. 8 may be added, removed, replaced, rearranged and repeated.

At step 802, a chip select logic state change of an nCS signal for an integrated circuit is configured to allow a controller to control the integrated circuit At step 804, an internal enable signal is configured to change from a first enable logic state to a second enable logic state in response to a data logic state of an SDI signal.

At step 806, in response to the second enable logic state of the internal enable signal, a HLD signal is generated for overwriting the nCS signal and the SDI signal when the internal enable signal is of the second enable logic state.

Referring back to FIGS. 3 and 6, the nCS signal and the SDI signal are from the controller, the chip select logic state change of the nCS signal is from a chip select logic high state to a chip select logic low state, the data logic state of the SDI signal is a data logic high state, the first enable logic state is an enable logic low state, and the second enable logic state is an enable logic high state.

Referring back to FIG. 5, the internal enable signal is generated by an integrated circuit enable control circuit comprising a digital core circuit configured to generate the HLD signal, and an enable circuit having a first input configured to receive the SDI signal, a second input configured to receive the nCS signal, a third input configured to receive the HLD signal, and an output configured to generate the internal enable signal for controlling the integrated circuit.

Referring back to FIG. 6, the method further comprises after a predetermined delay counting from the rising edge of the internal enable signal, generating, by the digital core circuit, the HLD signal having a HLD logic high state, wherein the HLD logic high state of the HLD signal fed into the third input of the enable circuit overwrites the nCS signal and the SDI signal.

Referring back to FIG. 6, the method further comprises in response to a power-down command from the controller, configuring the HLD signal to change from a HLD logic high state to a HLD logic low state.

Referring back to FIG. 6, the method further comprises in response to a power-down command from the controller, after a predetermined delay, configuring the HLD signal to change from a HLD logic high state to a HLD logic low state.

Referring back to FIG. 6, the method further comprises in response to the enable logic high state of the internal enable signal, configuring the integrated circuit to be powered up, and in response to the enable logic low state of the internal enable signal, configuring he integrated circuit to be powered down.

Referring back to FIG. 5, the enable circuit comprises a first n-type transistor, a second n-type transistor, a third n-type transistor, a first p-type transistor, a second p-type transistor, a first resistor, a second resistor, a third resistor and a Zener diode, and wherein the first p-type transistor, the second n-type transistor and the second resistor are connected in series between a power supply bus and ground, the third n-type transistor is coupled between the first p-type transistor and ground, the second p-type transistor and the Zener diode are connected in series between the power supply bus and ground, the third resistor is connected in parallel with the Zener diode, a gate of the second n-type transistor is configured to receive the SDI signal through the first resistor, a gate of the third n-type transistor is configured to receive the HLD signal, a gate of the first p-type transistor and a gate of the second p-type transistor are connected together and further connected to a drain of the first p-type transistor, the internal enable signal is generated at a common node of the second p-type transistor and the Zener diode, a drain of the first n-type transistor is connected to the gate of the second n-type transistor, a gate of the first n-type transistor is configured to receive the nCS signal, and a source of the first n-type transistor is connected to ground.

Referring back to FIG. 5, a fourth n-type transistor coupled between the gate of the second n-type transistor and ground, wherein a gate of the fourth n-type transistor is configured to receive the HLD signal.

Although embodiments of the present disclosure and its advantages have been described in detail, it should be understood that various changes, substitutions and alterations can be made herein without departing from the spirit and scope of the disclosure as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:
1. An apparatus comprising:
an enable circuit having a first input configured to receive a serial data in (SDI) signal, a second input configured to receive a not chip select (nCS) signal, a third input configured to receive a hold (HLD) signal, and an output configured to generate an internal enable signal for controlling a power-up process and a power-down process of an integrated circuit; and a digital core circuit configured to generate the HLD signal after the integrated circuit is powered up by the SDI signal and the nCS signal.

2. The apparatus of claim 1, wherein:
the enable circuit comprises a first n-type transistor, a second n-type transistor, a third n-type transistor, a first p-type transistor, a second p-type transistor, a first resistor, a second resistor, a third resistor and a Zener diode, and wherein:
  the first p-type transistor, the second n-type transistor and the second resistor are connected in series between a power supply bus and ground;
  the third n-type transistor coupled between the first p-type transistor and ground;
  the second p-type transistor and the Zener diode are connected in series between the power supply bus and ground;
  the third resistor is connected in parallel with the Zener diode;
  a gate of the second n-type transistor is configured to receive the SDI signal through the first resistor and the nCS signal through the first n-type transistor;
  a gate of the third n-type transistor is configured to receive the HLD signal;
  a gate of the first p-type transistor and a gate of the second p-type transistor are connected together and further connected to a drain of the first p-type transistor;
  the internal enable signal is generated at a common node of the second p-type transistor and the Zener diode;
  a drain of the first n-type transistor is connected to the gate of the second n-type transistor;
  a gate of the first n-type transistor is configured to receive the nCS signal; and
  a source of the first n-type transistor is connected to ground.

3. The apparatus of claim 2, further comprising:
a fourth n-type transistor, wherein:
  a gate of the fourth n-type transistor is configured to receive the HLD signal;
  a drain of the fourth n-type transistor is connected to a gate of the second n-type transistor; and
  a source of the fourth n-type transistor is connected to ground.

4. The apparatus of claim 1, wherein:
in response to a rising edge of the internal enable signal, the digital core circuit configures the HLD signal to change from a HLD logic low state to a HLD logic high state; and
in response to a command from a controller, the digital core circuit configures the HLD signal to change from the HLD logic high state to the HLD logic low state.

5. The apparatus of claim 4, wherein:
after a predetermined delay, the HLD signal changes from the HLD logic high state to the HLD logic low state;
the internal enable signal changes from an enable logic high state to an enable logic low state immediately following a logic change of the HLD signal; and
the integrated circuit is powered down once the internal enable signal has the enable logic low state.

6. The apparatus of claim 4, wherein:
the HLD logic high state of the HLD signal overwrites the SDI signal, the nCS signal and a combination of the SDI signal and the nCS signal.

7. The apparatus of claim 1, wherein:
in response to an enable logic high state of the internal enable signal, the integrated circuit is powered up; and
in response to an enable logic low state of the internal enable signal, the integrated circuit is powered down.

8. The apparatus of claim 7, wherein:
in response to a falling edge of the nCS signal, a chip select logic state change of the nCS signal for the integrated circuit is configured to allow a controller to control the integrated circuit; and
a logic high state of the SDI signal results in the enable logic high state of the internal enable signal.

9. A method comprising:
configuring a chip select logic state change of an nCS signal for an integrated circuit to allow a controller to control the integrated circuit;
configuring an internal enable signal to change from a first enable logic state to a second enable logic state in response to a data logic state of an SDI signal; and
in response to the second enable logic state of the internal enable signal, generating a HLD signal for overwriting the nCS signal and the SDI signal when the internal enable signal is of the second enable logic state.

10. The method of claim 9, wherein:
the nCS signal and the SDI signal are from the controller;
the chip select logic state change of the nCS signal is from a chip select logic high state to a chip select logic low state;
the data logic state of the SDI signal is a data logic high state;
the first enable logic state is an enable logic low state; and
the second enable logic state is an enable logic high state.

11. The method of claim 10, wherein the internal enable signal is generated by an integrated circuit enable control circuit comprising:
a digital core circuit configured to generate the HLD signal; and
an enable circuit having a first input configured to receive the SDI signal, a second input configured to receive the nCS signal, a third input configured to receive the HLD signal, and an output configured to generate the internal enable signal for controlling the integrated circuit.

12. The method of claim 11, further comprising:
after a predetermined delay counting from the rising edge of the internal enable signal, generating, by the digital core circuit, the HLD signal having a HLD logic high state, wherein the HLD logic high state of the HLD signal fed into the third input of the enable circuit overwrites the nCS signal and the SDI signal.

13. The method of claim 11, further comprising:
in response to a power-down command from the controller, configuring the HLD signal to change from a HLD logic high state to a HLD logic low state.

14. The method of claim 11, further comprising:
in response to a power-down command from the controller, after a predetermined delay, configuring the HLD signal to change from a HLD logic high state to a HLD logic low state.

15. The method of claim 11, further comprising:
in response to the enable logic high state of the internal enable signal, configuring the integrated circuit to be powered up; and in response to the enable logic low state of the internal enable signal, configuring he integrated circuit to be powered down.

16. The method of claim 11, wherein:
the enable circuit comprises a first n-type transistor, a second n-type transistor, a third n-type transistor, a first p-type transistor, a second p-type transistor, a first resistor, a second resistor, a third resistor and a Zener diode, and wherein:
the first p-type transistor, the second n-type transistor and the second resistor are connected in series between a power supply bus and ground;
the third n-type transistor is coupled between the first p-type transistor and ground;
the second p-type transistor and the Zener diode are connected in series between the power supply bus and ground;
the third resistor is connected in parallel with the Zener diode;
a gate of the second n-type transistor is configured to receive the SDI signal through the first resistor;
a gate of the third n-type transistor is configured to receive the HLD signal;
a gate of the first p-type transistor and a gate of the second p-type transistor are connected together and further connected to a drain of the first p-type transistor;
the internal enable signal is generated at a common node of the second p-type transistor and the Zener diode;
a drain of the first n-type transistor is connected to the gate of the second n-type transistor;
a gate of the first n-type transistor is configured to receive the nCS signal; and
a source of the first n-type transistor is connected to ground.

17. The method of claim 16, further comprising:
a fourth n-type transistor coupled between the gate of the second n-type transistor and ground, wherein a gate of the fourth n-type transistor is configured to receive the HLD signal.

18. A system comprising:
a controller coupled a plurality of integrated circuits, wherein each integrated circuit comprises:
an enable circuit having a first input configured to receive an SDI signal, a second input configured to receive an nCS signal, a third input configured to receive a HLD signal, and an output configured to generate an internal enable signal for controlling a power-up process and a power-down process of an integrated circuit; and
a digital core circuit configured to generate the HLD signal after the integrated circuit is powered-up by the SDI signal and the nCS signal.

19. The system of claim 18, wherein:
the enable circuit comprises a first n-type transistor, a second n-type transistor, a third n-type transistor, a first p-type transistor, a second p-type transistor, a first resistor, a second resistor, a third resistor and a Zener diode, and wherein:
the first p-type transistor, the second n-type transistor and the second resistor are connected in series between a power supply bus and ground;
the third n-type transistor is coupled between the first p-type transistor and ground;
the second p-type transistor and the Zener diode are connected in series between the power supply bus and ground;
the third resistor is connected in parallel with the Zener diode;
a gate of the second n-type transistor is configured to receive the SDI signal through the first resistor;
a gate of the third n-type transistor is configured to receive the HLD signal;
a gate of the first p-type transistor and a gate of the second p-type transistor are connected together and further connected to a drain of the first p-type transistor;
the internal enable signal is generated at a common node of the second p-type transistor and the Zener diode;
a drain of the first n-type transistor is connected to the gate of the second n-type transistor;
a gate of the first n-type transistor is configured to receive the nCS signal; and
a source of the first n-type transistor is connected to ground.

20. The system of claim 19, further comprising:
a fourth n-type transistor connected between the gate of the second n-type transistor and ground, wherein a gate of the fourth n-type transistor is configured to receive the HLD signal.

\* \* \* \* \*